United States Patent [19]
Iba

[11] Patent Number: 5,715,040
[45] Date of Patent: Feb. 3, 1998

[54] ILLUMINATION APERTURE OF LOW INTENSITY LOSS

[75] Inventor: Junichiro Iba, Wappingers Falls, N.Y.

[73] Assignee: Kabushiki Kaisha Toshiba, Japan

[21] Appl. No.: 542,327

[22] Filed: Oct. 12, 1995

[51] Int. Cl.⁶ .................... F21V 7/00; G03B 27/42; G03B 27/54
[52] U.S. Cl. .................. 355/67; 355/53; 355/71; 362/296
[58] Field of Search .................. 355/46, 53, 67, 355/71, 35; 362/298, 299, 301, 302, 303, 304, 305

[56] References Cited

U.S. PATENT DOCUMENTS

| | | | |
|---|---|---|---|
| 3,848,997 | 11/1974 | Muehloegger | 355/71 |
| 4,095,881 | 6/1978 | Maddox | 355/30 |
| 4,143,966 | 3/1979 | Gandini . | |
| 4,295,186 | 10/1981 | Sugiura et al. | 362/217 |
| 4,519,020 | 5/1985 | Little . | |
| 4,739,456 | 4/1988 | Little . | |
| 4,964,705 | 10/1990 | Markle . | |
| 5,040,882 | 8/1991 | Markle . | |
| 5,124,891 | 6/1992 | Blusseau | 362/61 |
| 5,144,362 | 9/1992 | Kamon et al. | 355/53 |
| 5,235,499 | 8/1993 | Bertenshaw | 362/297 |
| 5,309,340 | 5/1994 | Shigeta et al. | 362/299 |
| 5,355,194 | 10/1994 | Zumoto et al. . | |
| 5,357,312 | 10/1994 | Tounai . | |
| 5,369,557 | 11/1994 | Ronney | 362/285 |
| 5,396,311 | 3/1995 | Fukushima et al. | 355/71 |
| 5,438,495 | 8/1995 | Ahlen et al. | 362/153.1 |
| 5,467,166 | 11/1995 | Shiraishi | 355/71 |
| 5,477,653 | 12/1995 | Altmayer | 52/311.1 |
| 5,491,525 | 2/1996 | Yamasaki et al | 353/98 |
| 5,535,111 | 7/1996 | Wedell | 362/304 |
| 5,552,856 | 9/1996 | Shiraishi et al. | 355/53 |
| 5,565,958 | 10/1996 | Kaplan | 355/67 |

*Primary Examiner*—R. L. Moses
*Assistant Examiner*—Shival Virmani
*Attorney, Agent, or Firm*—Banner & Witcoff, Ltd.

[57] ABSTRACT

In a photolithography system, an illumination assembly to provide intensified uniform illumination includes an illumination source reflector and a plate having an aperture opening therethrough and a mirrored surface thereon, the mirrored surface of the plate confronting the illumination source reflector. The illumination assembly further includes an illumination source for generating illumination disposed between the illumination source reflector and the plate.

15 Claims, 8 Drawing Sheets

ILLUMINATION APERTURE OF LOW INTENSITY LOSS

BACKGROUND OF THE INVENTION

1. Field of the Invention

The present invention relates to photolithography systems, and in particular, the invention relates to an improved illumination aperture for use in an illumination assembly of a photolithography system.

2. Description of Related Art

Figure 1:
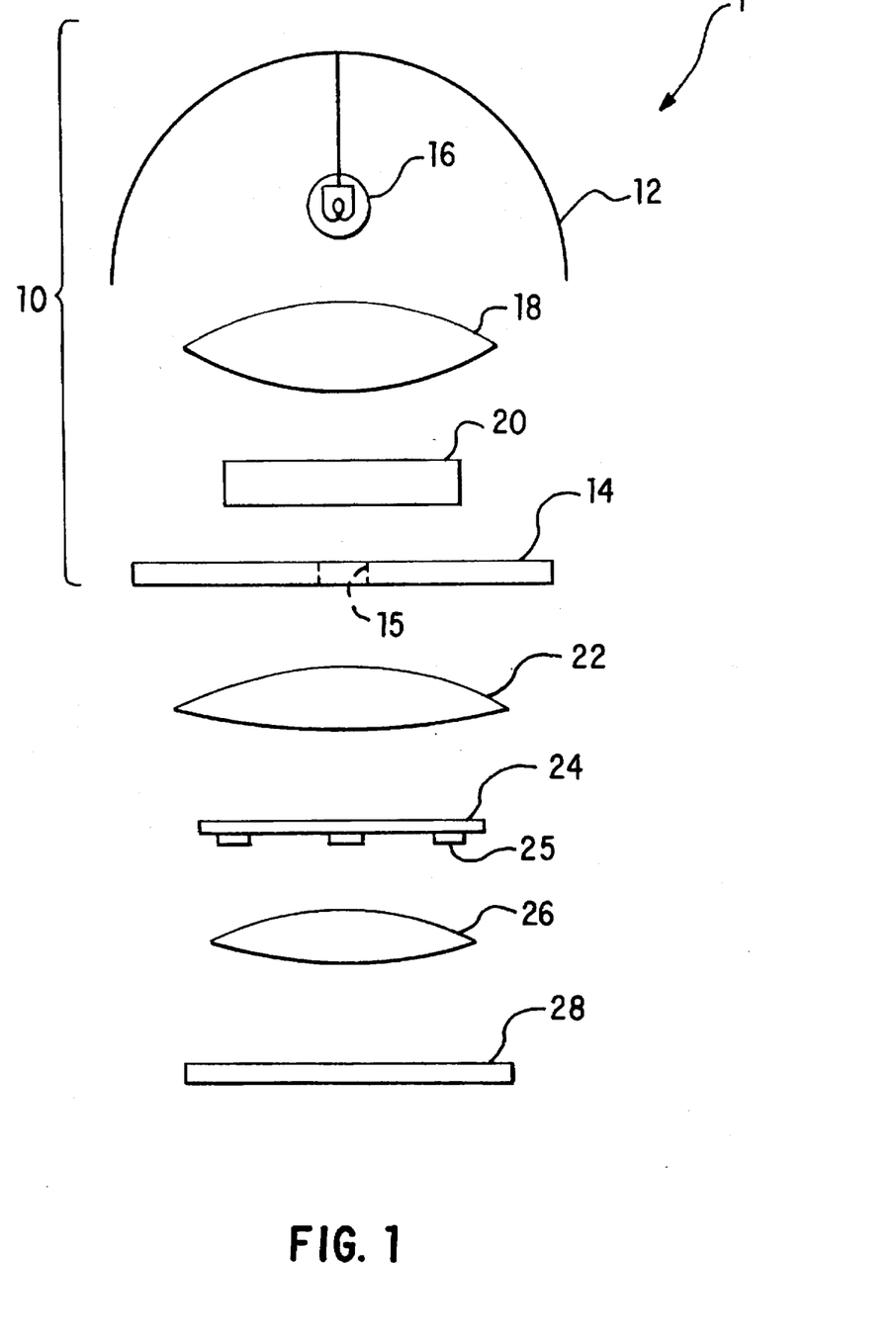
FIG. 1 is a schematic diagram of photolithography system 1.
Figure 2A:
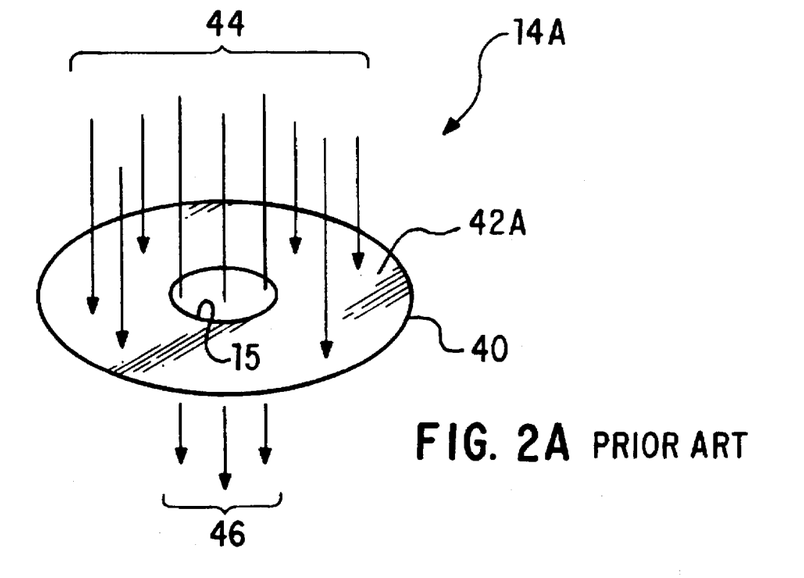
FIG. 2A is a perspective view of a conventional aperture.

FIG. 1 illustrates photolithography system 1 containing illumination assembly 10 which in turn contains aperture 14 having aperture opening 15 therethrough. In FIG. 2A, conventional aperture 14A includes plate 40 in the form of a disk having aperture opening 15 therethrough. Incident light 44 from an illumination source passes through the aperture opening to mask 24 (FIG. 1) and related portions of photolithography system 1. The disk blocks or absorbs incident light at aperture surface 42A except for light passing through aperture opening 15 as the illumination from illumination assembly 10.

In the conventional arrangement, only a portion of light from illumination source 16 passes through the aperture opening to mask 24 and related portions of the photolithography system. When the aperture opening is off-axis or has a small sigma (i.e., small opening), the light intensity is further decreased. It is desired to pass a larger portion of the light from the illumination source to the mask and related portions of the photolithography system and to provide a more uniform illumination of the mask.

SUMMARY OF THE INVENTION

It is an object to the present invention to overcome limitations of the prior art. It is a further object of the present invention to provide an illumination assembly of a photolithography system which outputs more intensified and more uniform light then known illumination assemblies, and which operates cooler and requires less intensity from the illumination source than known illumination assemblies.

These and other objects are achieved in an illumination assembly of a photolithography system. The illumination assembly provides intensified uniform illumination and includes an illumination source reflector and a plate having an aperture opening therethrough and a mirrored surface thereon, the mirrored surface of the plate confronting the illumination source reflector. The illumination assembly further includes an illumination source for generating illumination disposed between the illumination source reflector and the plate.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

FIG. 1 depicts illumination assembly 10 of photolithography system 1 in which the improved illumination aperture 14B (FIG. 2B) is used. In the photolithography system, illumination assembly 10 includes illumination source reflector 12 (typically parabolic in shape), improved illumination aperture 14B (i.e., a plate 40 having aperture opening 15 therethrough and a mirrored surface 42B, FIG. 2B), and illumination source 16 for generating illumination disposed between illumination source reflector 12 and aperture 14B. Relay lens 18 passes light from illumination source 16 and reflector 12 through to fly-eye lens 20. Fly-eye lens 20 mixes and homogenizes light from relay lens 18 as it passes through to aperture 14. Improved illumination aperture 14B is disposed with respect to illumination source reflector 12 so that mirrored surface 42B (FIG. 2B) is oriented toward illumination source reflector 12 so as to confront the illumination source reflector.

Figure 7A:
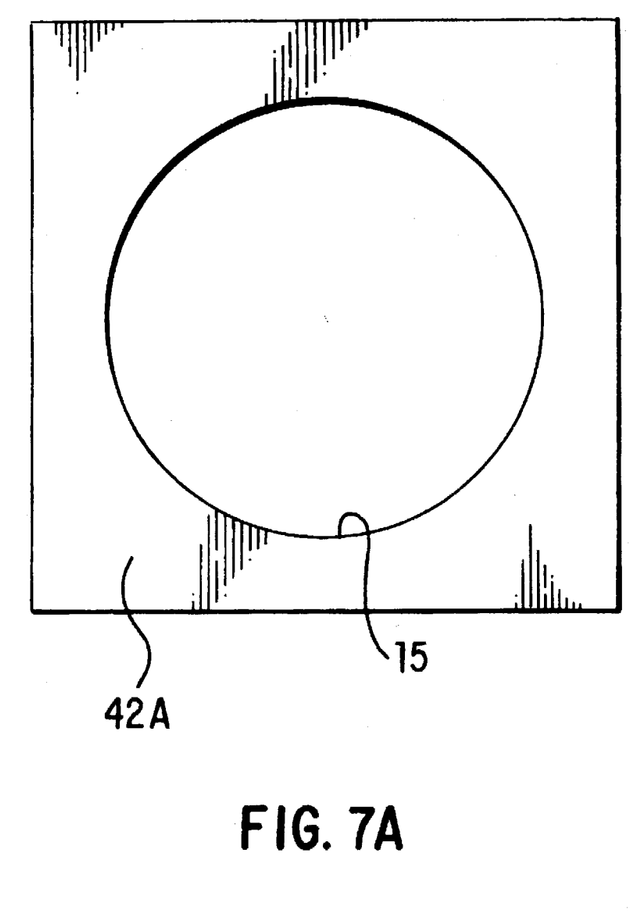
FIGS. 7A–7D are diagrams showing embodiments of aperture 14 depicted in FIG. 1.

FIG. 7A shows a conventional aperture corresponding to aperture 14A and having non-mirrored surface 42A and aperture opening 15.

Figure 7B:
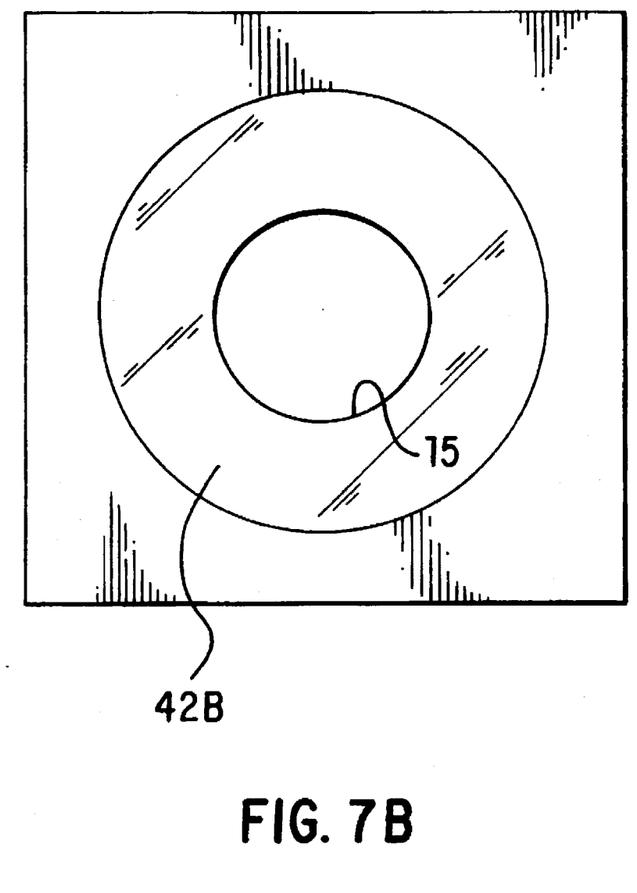

FIG. 7B shows an improved aperture corresponding to aperture 14B and having mirrored surface 42B and aperture opening 15. Aperture opening 15 in improved aperture 14B is smaller than aperture opening 15 in conventional aperture 14A, and the smaller aperture is referred to as a small sigma aperture.

Figure 7C:
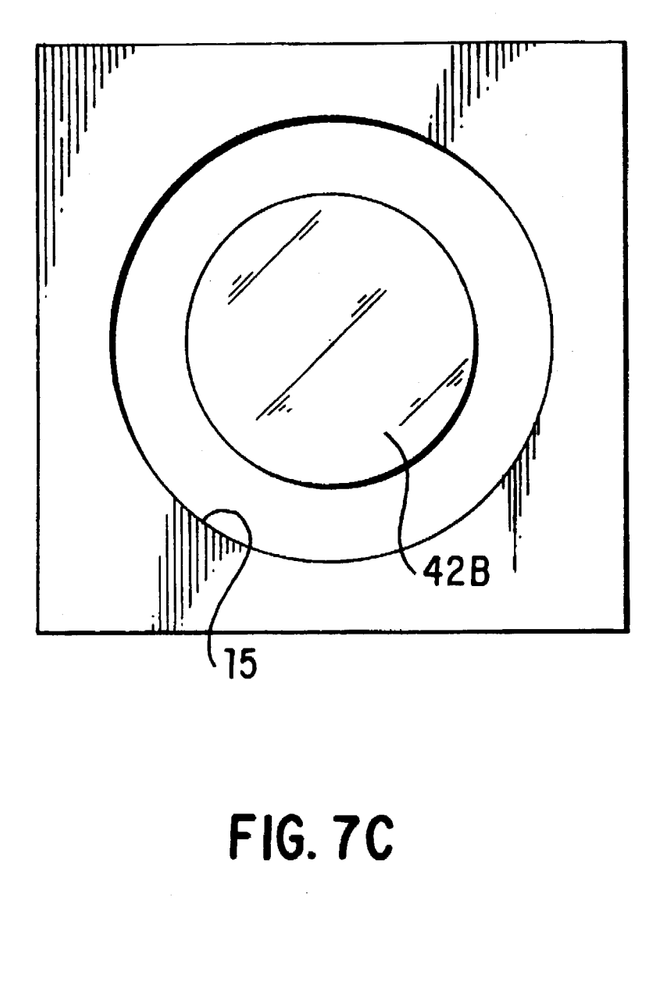

FIG. 7C shows an alternative embodiment of improved aperture 14B. In FIG. 7C, mirrored surface 42B is in the form of a circular disk surrounded by aperture 15 in the form of an annular ring.

Figure 7D:
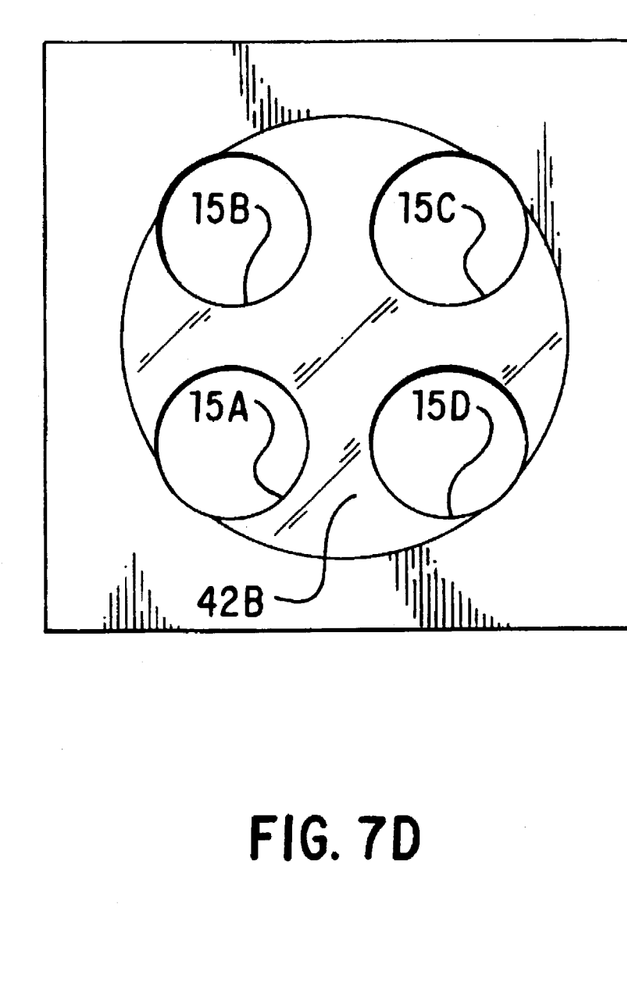

FIG. 7D shows yet another alternative embodiment of improved aperture 14B (called a four eye aperture). In FIG. 7D, mirrored surface 42B is in the form of a circular disk out of which is opened four smaller circular aperture openings designated 15A, 15B, 15C and 15D.

Figure 2B:
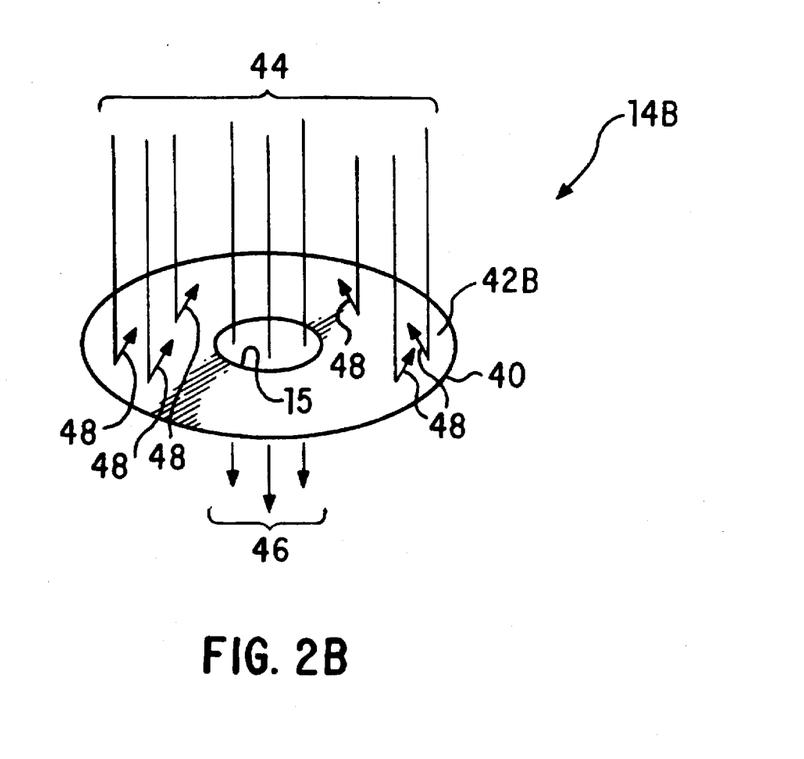
FIG. 2B is a perspective view of an aperture according to the invention.

In FIG. 2B, a first portion 46 of incident light 44 passes through aperture opening 15, remaining portions of incident light being reflected by mirrored surface 42B as reflected light 48.

Figure 3:
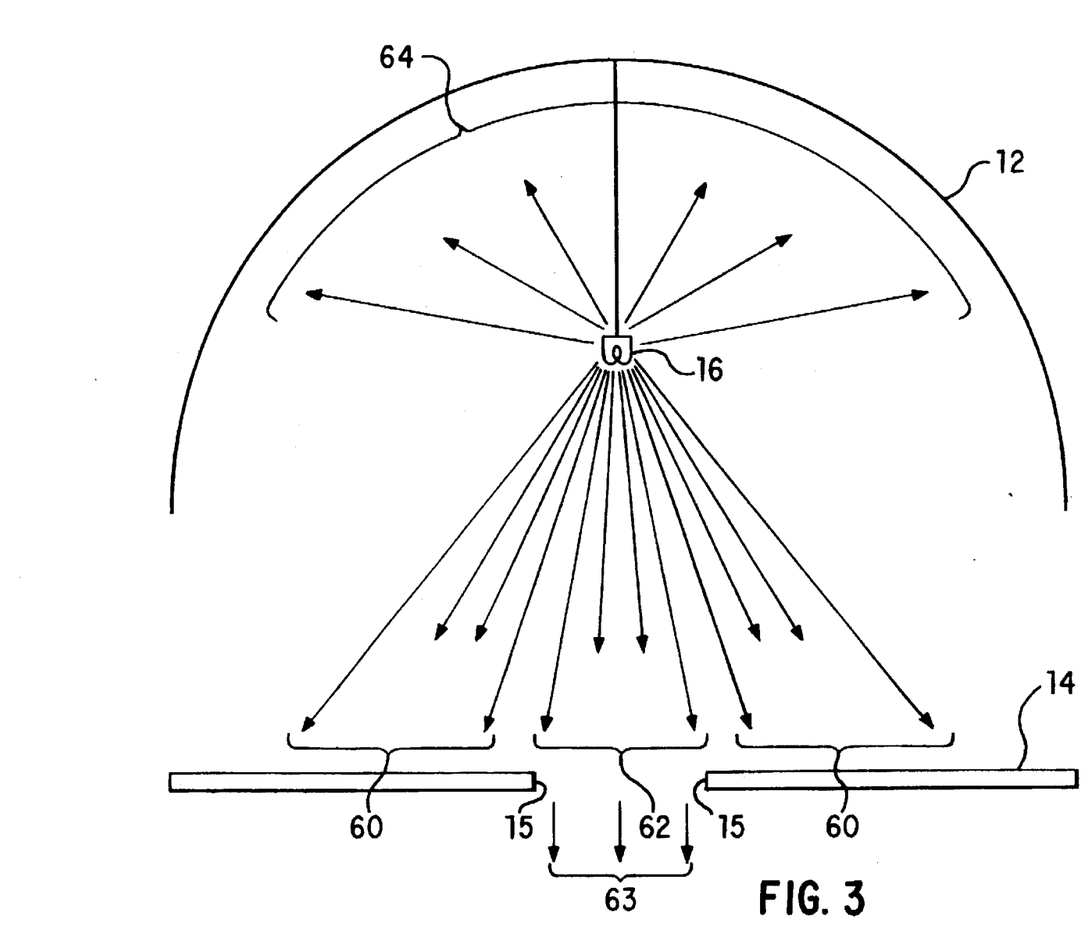
FIGS. 3, 4A–4C, 5A, 5B and 6 are a simplified optical schematic diagrams according to the present invention.

In FIG. 3, illumination generated by illumination source 16 maybe categorized generally into three categories: a first portion of generated illumination 60 which impinges on aperture 14 (i.e., improved aperture 14B), a second portion of generated illumination 62 which passes through aperture opening 15 as a first portion of intensified uniform illumination 63, and third portion of generated illumination 64 which impinges on illumination source reflector 12.

Figure 4A:
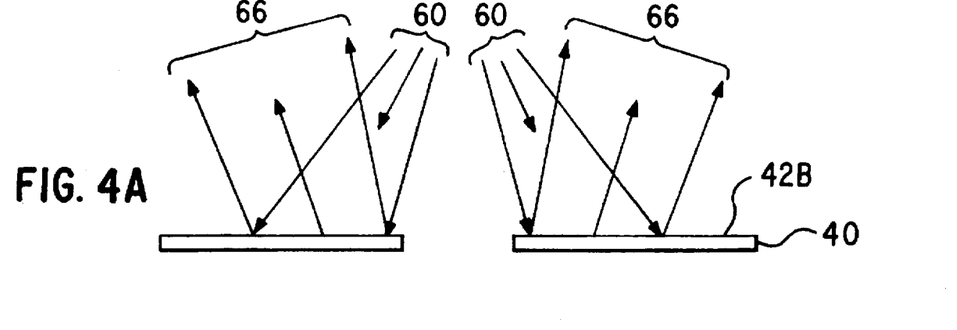

In FIG. 4A, the first portion of generate illumination 60 impinges on mirrored surface 42B of aperture 14 and is reflected as first reflected illumination 66.

Figure 4B:
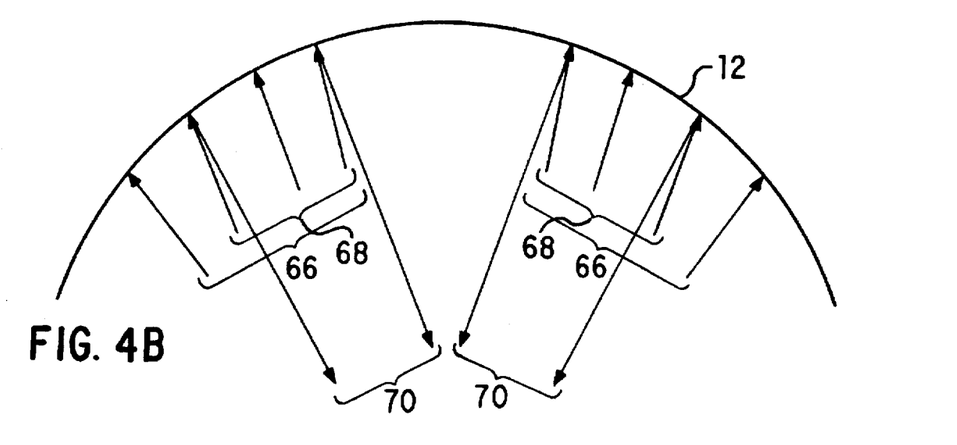

In FIG. 4B, first portion 68 of first reflected illumination 66 impinges on illumination source reflector 12 and is reflected as second reflected illumination 70.

Figure 4C:
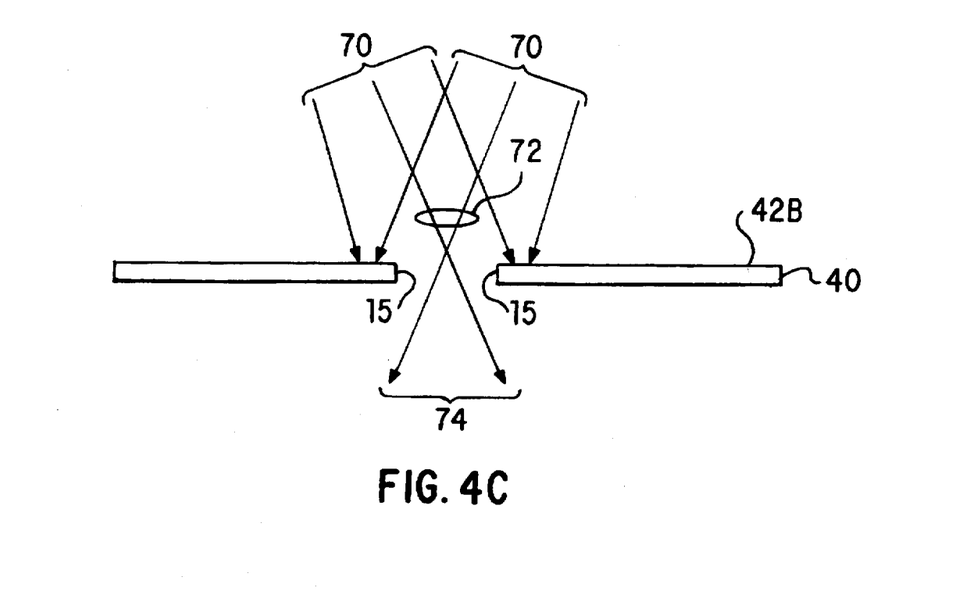

In FIG. 4C, a first portion 72 of second reflected illumination 70 passes through aperture opening 15 as a second portion of intensified uniform illumination 74.

Figure 5A:
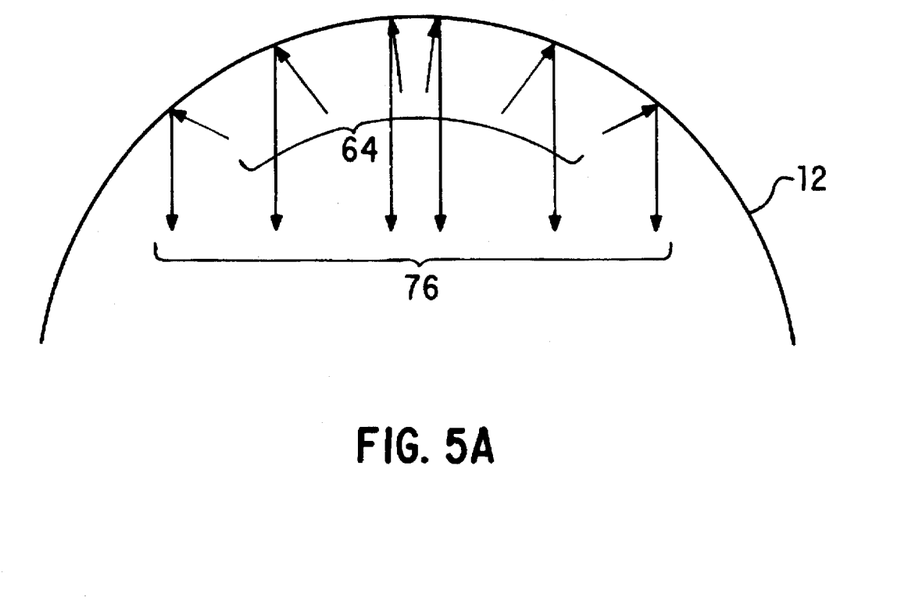

In FIG. 5A, a third portion of generated illumination 64 impinges on illumination source reflector 12 and is reflected as third reflected illumination 76.

Figure 5B:
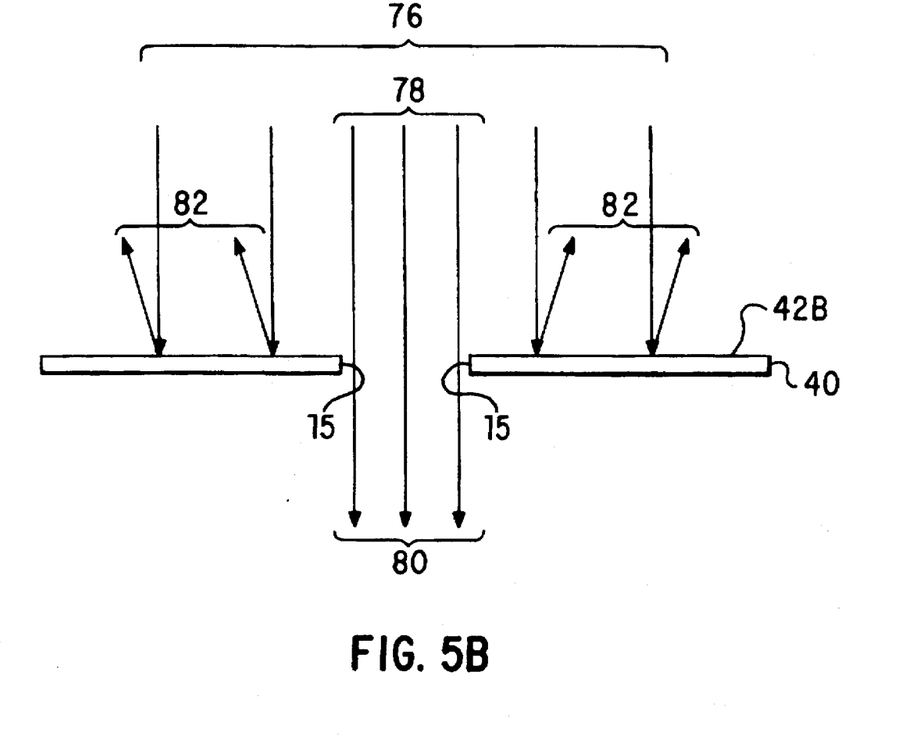

In FIG. 5B, a first portion 78 of third reflected illumination 76 passes through aperture opening 15 as a third portion of intensified uniform illumination 80. Remaining portions of third reflected illumination 76 are reflected by mirrored surface 42B as further reflected illumination 82. It will be appreciated by persons skilled in the art that further reflected illumination 82 constitutes additional illumination to combine with first reflected illumination 66 (FIG. 4A), and that illumination may be repeatedly reflected between mirrored surface 42B and illumination source reflector 12 before eventually passing through aperture opening 15 as the intensified uniform illumination.

Conventional illumination assemblies lack the mirrored surface 42B, and accordingly block or absorb illumination impinging thereon. Absorbed illumination will eventually be converted into heat. In conventional illumination assemblies, it is necessary to increase the intensity of the illumination source to provide adequate illumination intensity passing through aperture opening 15, where a portion of the illumination is absorbed by aperture 14 and the energy thereof converted to heat. With the improved aperture having mirrored surface 42B thereon, only insignificant portions of illumination from illumination source 16 is absorbed in aperture 14. Substantially all of the illumination from illumination source 16 will eventually pass through aperture opening 15 to provide a intensified uniform illumination. Therefore, illumination source 16 may be provided with less power than would be required in conventional illumination assemblies; illumination assembly 10 of the present invention will operate cooler than conventional illumination assemblies; and the illumination through aperture opening 15 is more uniformly distributed than with conventional illumination assemblies.

Figure 6:
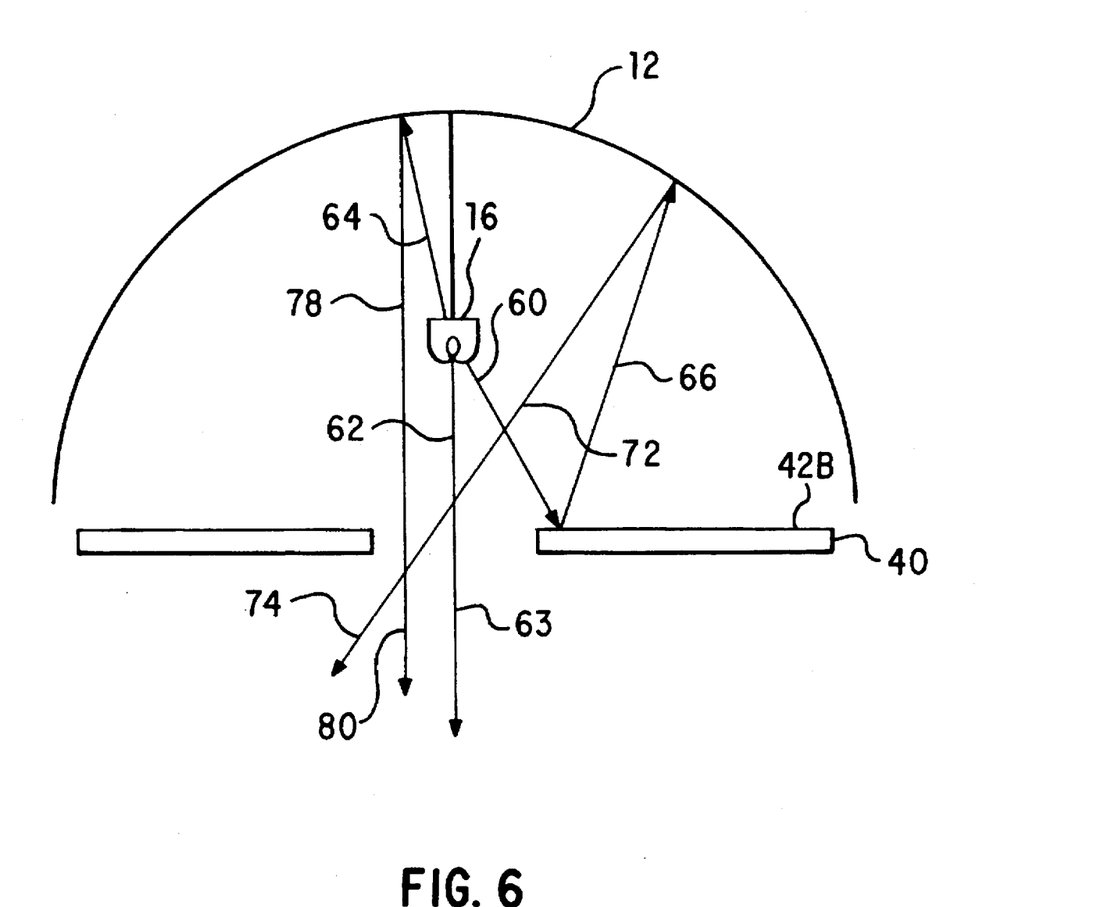

In FIG. 6, illumination paths are illustrated by exemplary single rays of light. Illumination source 16 provides first portion of generated illumination 60, second portion of generated illumination 62 and third portion generated illumination 64. First portion of generated illumination 60 reflects from mirrored surface 42B of plate 40 as first reflected illumination 66. First reflected illumination 66 reflects from illumination source reflector 12 as second reflected illumination 70, and a first portion 72 of second reflected illumination 70 passes aperture opening 15 as second portion of the intensified uniform illumination 74. Second portion of generated illumination 62 passes through aperture opening 15 as first portion of intensified uniform illumination 63. Third portion of generated illumination 64 reflects from illumination source reflector 12 as third reflected illumination 76, and a first portion 78 of third reflected illumination 76 passes through aperture opening 15 as third portion of intensified uniform illumination 80. The combination of first, second and third portions of the intensified uniform illumination provide an intense uniform illumination source through aperture opening 15. The illumination repeatedly reflected between mirrored surface 42B and illumination source reflector 12, appears as a concentrated source of illumination located near aperture opening 15 (actually approximating a point slightly back from aperture opening 15 toward illumination source 16 in FIG. 6). Therefore, illumination passing through aperture opening 15 is more easily collimated by collimating lens 22 into a uniform distribution of illumination intensity.

A typical reflection coefficient for reflector 12 is 0.90. When aperture opening 15 of improve aperture 14B extends over 50% of the area of aperture opening 15 of conventional aperture 14A, the intensity of the light passing through aperture opening 15 of improved aperture 14B relative to opening 15 of conventional aperture 14A is 53%, 58%, 65%, 73%, 84% and 90% when mirrored surface 42B of improved aperture 14B is characterized by a reflection coefficient equal to 0.1, 0.3, 0.5, 0.7, 0.9 and 1.0, respectively. An aperture with a small sigma opening can achieve a light intensity comparable to an aperture with a large sigma opening by including on the aperture surface a highly reflective mirrored surface (i.e., surface 42B). Similarly, an improved aperture with a highly reflective mirrored surface can achieve light intensifies comparable with a corresponding conventional aperture, but the improved aperture can achieve the required light intensity using a lower power illumination source 16 than is required when a conventional aperture is used.

Referring again to FIG. 1, the intensified uniform illumination provided through aperture opening 15 is collimated in collimating lens 22. The collimated illumination illuminates mask 24 having image-wise information 25 contain thereon so that collimated image-wise information passes to focusing lens 26. Focusing lens 26 focuses the collimated image-wise information containing light onto wafer 28 in photolithography system 1.

Having described preferred embodiments of a novel exchangeable hierarchical data line structure (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. In a photolithography system, an illumination assembly to provide intensified uniform illumination, the illumination assembly comprising:

an illumination source reflector;

a plate having an aperture opening therethrough and a mirrored surface thereon, the mirrored surface of the plate confronting the illumination source reflector; and an illumination source for generating illumination disposed between the illumination source reflector and the plate.

2. The assembly of claim 1, wherein the plate is disposed with respect to the illumination source reflector so that:

the intensified uniform illumination includes at least first and second portions of the intensified uniform illumination;

the generated illumination from the illumination source includes at least first and second portions;

the first portion of the generated illumination from the illumination source reflects from the mirrored surface of the plate as first reflected illumination, the first reflected illumination including at least a first portion of the first reflected illumination;

the second portion of the generated illumination from the illumination source passes through the aperture opening in the plate as the first portion of the intensified uniform illumination; and the first portion of the first reflected illumination reflects from the illumination source reflector as second reflected illumination, the second reflected illumination including at least a first portion; and the first portion of the second reflected illumination passes through the aperture opening of the plate as the second portion of the intensified uniform illumination.

3. The assembly of claim 2, wherein:

the intensified uniform illumination further includes a third portion of the intensified uniform illumination;

the generated illumination from the illumination source includes a third portion;

the third portion of the generated illumination from the illumination source reflects from the illumination source reflector as third reflected illumination, the third reflected illumination including at least a first portion of the third reflected illumination;

the first portion of the third reflected illumination passes through the aperture opening of the plate as the third portion of the intensified uniform illumination.

4. The assembly of claim 1, wherein the plate is disposed with respect to the illumination source reflector so that:

the intensified uniform illumination includes at least first and second portions of the intensified uniform illumination;

the generated illumination from the illumination source includes first, second and third portions;

the first portion of the generated illumination from the illumination source reflects from the mirrored surface of the plate as first reflected illumination;

the second portion of the generated illumination from the illumination source passes through the aperture opening in the plate as the first portion of the intensified uniform illumination;

the third portion of the generated illumination from the illumination source reflects from the illumination source reflector as second reflected illumination, the second reflected illumination including at least a first portion of the first reflected illumination; and the first portion of the second reflected illumination passes through the aperture opening of the plate as the second portion of the intensified uniform illumination.

5. The assembly of claim 4, wherein:

the intensified uniform illumination further includes a third portion of the intensified uniform illumination;

the first reflected illumination includes at least a first portion of the first reflected illumination;

the first portion of first reflected illumination reflects from the illumination source reflector as third reflected illumination, the third reflected illumination including at least a first portion; and the first portion of the third reflected illumination from the illumination source reflector passes through the aperture opening of the plate as the third portion of the intensified uniform illumination.

6. The assembly of claim 1, wherein the mirrored surface of the plate is characterized by a reflection coefficient, the reflection coefficient being greater than 0.3.

7. The assembly of claim 1, wherein the mirrored surface of the plate is characterized by a reflection coefficient, the reflection coefficient being greater than 0.9.

8. In an illumination assembly of a photolithography system, the illumination assembly including an illumination source reflector and a plate having an aperture opening therethrough and a mirrored surface thereon, an illumination source being disposed between the illumination source reflector and the plate, a method of providing intensified uniform illumination, the intensified uniform illumination including at least first and second portions, the method comprising steps of:

generating at least first and second portions of generated illumination from the illumination source;

reflecting the first portion of the generated illumination from the mirrored surface of the plate as first reflected illumination, the first reflected illumination including at least a first portion of the first reflected illumination;

passing the second portion of the generated illumination through the aperture opening in the plate as the first portion of the intensified uniform illumination;

reflecting the first portion of the first reflected illumination from the illumination source reflector as second reflected illumination, the second reflected illumination including at least a first portion; and passing the first portion of the second reflected illumination through the aperture opening of the plate as the second portion of the intensified uniform illumination.

9. The method of claim 8, wherein:

the intensified uniform illumination further includes a third portion of the intensified uniform illumination;

the step of generating first and second portions of generated illumination further includes generating a third portion of the generated illumination from the illumination source;

the method further includes a step of reflecting the third portion of the generated illumination from the illumination source reflector as third reflected illumination, the third reflected illumination including at least a first portion of the third reflected illumination; and the method further includes a step of passing the first portion of the third reflected illumination through the aperture opening of the plate as the third portion of the intensified uniform illumination.

10. In a photolithography system, an illumination assembly to provide intensified uniform illumination, the illumination assembly comprising:

an illumination source reflector;

a plate having an aperture opening therethrough and a mirrored surface thereon, the mirrored surface of the plate confronting the illumination source reflector; and an illumination source for generating illumination disposed between the illumination source reflector and the plate;

wherein the plate is disposed with respect to the illumination source reflector so that:

the intensified uniform illumination includes at least first and second portions of the intensified uniform illumination;

the generated illumination from the illumination source includes at least first and second portions;

the first portion of the generated illumination from the illumination source reflects from the mirrored surface of the plate as first reflected illumination, the first reflected illumination including at least a first portion of the first reflected illumination;

the second portion of the generated illumination from the illumination source passes through the aperture opening in the plate as the first portion of the intensified uniform illumination; and the first portion of the first reflected illumination reflects from the illumination source reflector as second reflected illumination, the second reflected illumination including at least a first portion; and the first portion of the second reflected illumination passes through the aperture opening of the plate as the second portion of the intensified uniform illumination.

11. The assembly of claim 10, wherein:

the intensified uniform illumination further includes a third portion of the intensified uniform illumination;

the generated illumination from the illumination source includes a third portion;

the third portion of the generated illumination from the illumination source reflects from the illumination source reflector as third reflected illumination, the third reflected illumination including at least a first portion of the third reflected illumination;

the first portion of the third reflected illumination passes through the aperture opening of the plate as the third portion of the intensified uniform illumination.

12. In a photolithography system, an illumination assembly to provide intensified uniform illumination, the illumination assembly comprising:

an illumination source reflector;

a plate having an aperture opening therethrough and a mirrored surface thereon, the mirrored surface of the plate confronting the illumination source reflector; and an illumination source for generating illumination disposed between the illumination source reflector and the plate;

wherein the plate is disposed with respect to the illumination source reflector so that;

the intensified uniform illumination includes at least first and second portions of the intensified uniform illumination;

the generated illumination from the illumination source includes first, second and third portions;

the first portion of the generated illumination from the illumination source reflects from the mirrored surface of the plate as first reflected illumination;

the second portion of the generated illumination from the illumination source passes through the aperture opening in the plate as the first portion of the intensified uniform illumination;

the third portion of the generated illumination from the illumination source reflects from the illumination source reflector as second reflected illumination, the second reflected illumination including at least a first portion of the first reflected illumination; and the first portion of the second reflected illumination passes through the aperture opening of the plate as the second portion of the intensified uniform illumination.

13. The assembly of claim 12, wherein:

the intensified uniform illumination further includes a third portion of the intensified uniform illumination;

the first reflected illumination includes at least a first portion of the first reflected illumination;

the first portion of the first reflected illumination reflects from the illumination source reflector as third reflected illumination, the third reflected illumination including at least a first portion; and the first portion of the third reflected illumination from the illumination source reflector passes through the aperture opening of the plate as the third portion of the intensified uniform illumination.

14. In a photolithography system, an illumination assembly to provide intensified uniform illumination, the illumination assembly comprising:

an illumination source reflector;

a plate having an aperture opening therethrough and a mirrored surface thereon, the mirrored surface of the plate confronting the illumination source reflector; and an illumination source for generating illumination disposed between the illumination source reflector and the plate;

wherein the mirrored surface of the plate is characterized by a reflection coefficient, the reflection coefficient being greater than 0.3.

15. In a photolithography system, an illumination assembly to provide intensified uniform illumination, the illumination assembly comprising:

an illumination source reflector;

a plate having an aperture opening therethrough and a mirrored surface thereon, the mirrored surface of the plate confronting the illumination source reflector; and an illumination source for generating illumination disposed between the illumination source reflector and the plate;

wherein the mirrored surface of the plate is characterized by a reflection coefficient, the reflection coefficient being greater than 0.9.

* * * * *